United States Patent
Sato et al.

(10) Patent No.: US 7,257,892 B2
(45) Date of Patent: Aug. 21, 2007

(54) METHOD OF MANUFACTURING WIRING BOARD

(75) Inventors: Naoya Sato, Sakata (JP); Akihito Narita, Sakata (JP); Satoru Akatsuka, Sakata (JP); Tsutomu Abe, Tsuruoka (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/357,796

(22) Filed: Feb. 17, 2006

(65) Prior Publication Data

US 2006/0185163 A1    Aug. 24, 2006

(30) Foreign Application Priority Data

Feb. 18, 2005    (JP) ............................. 2005-042119

(51) Int. Cl.
*H05K 3/02*    (2006.01)
*H01B 13/00*    (2006.01)
*H01R 13/648*    (2006.01)

(52) U.S. Cl. .............................. 29/846; 29/830; 29/831; 29/832; 29/847; 216/17; 174/360

(58) Field of Classification Search .................. 29/846, 29/847, 830, 831, 832; 204/230.6, 646; 216/17, 216/18, 83, 39; 428/64.1; 174/261, 250, 174/360, 48, 53, 75, 77.07, 77.08
See application file for complete search history.

(56) References Cited

U.S. PATENT DOCUMENTS

| 4,963,512 | A | * | 10/1990 | Iwanaga et al. | ............... 216/18 |
| 5,352,325 | A | * | 10/1994 | Kato | ............................ 216/18 |
| 5,436,411 | A | * | 7/1995 | Pasch | ......................... 174/261 |
| 5,653,893 | A | * | 8/1997 | Berg | ............................ 216/18 |
| 6,228,246 | B1 | * | 5/2001 | Datta et al. | ................. 205/646 |

FOREIGN PATENT DOCUMENTS

JP    06-342969    12/1994

* cited by examiner

*Primary Examiner*—A. Dexter Tugbang
*Assistant Examiner*—Tai Van Nguyen
(74) *Attorney, Agent, or Firm*—Harness, Dickey & Pierce, P.L.C.

(57) ABSTRACT

A method of manufacturing a wiring board, including: providing a resin substrate on which is formed a metal layer including a first layer and a second layer formed on the first layer; forming an interconnecting pattern by etching the metal layer so that the interconnecting pattern includes the patterned first layer and second layer and a part of the first layer remains outside the second layer as a residue of the first layer; electroless plating the interconnecting pattern and the residue of the first layer; and then washing the resin substrate. The washing of the resin substrate is performed by using at least one of an acidic solution used for dissolving and removing the residue of the first layer and a metal deposited on the residue of the first layer by the electroless plating and an alkaline solution used for dissolving the resin substrate to remove an area which supports the residue of the first layer.

4 Claims, 5 Drawing Sheets

METHOD OF MANUFACTURING WIRING BOARD

Japanese Patent Application No. 2005-42119, filed on Feb. 18, 2005, is hereby incorporated by reference in its entirety.

BACKGROUND OF THE INVENTION

The present invention relates to a method of manufacturing a wiring board.

It is known that a plating layer is formed on an interconnecting pattern by electroless plating (see JP-A-6-342969).

In order to manufacture a highly reliable wiring board, it is preferable to remove a plating solution after plating. A highly reliable wiring board can be manufactured by removing the plating solution in a short time.

SUMMARY

According to one aspect of the invention, there is provided a method of manufacturing a wiring board, comprising:

providing a resin substrate on which is formed a metal layer including a first layer and a second layer formed on the first layer;

forming an interconnecting pattern by etching the metal layer so that the interconnecting pattern includes the patterned first layer and second layer and a part of the first layer remains outside the second layer as a residue of the first layer;

electroless plating the interconnecting pattern and the residue of the first layer; and then washing the resin substrate, the washing of the resin substrate being performed by using at least one of an acidic solution used for dissolving and removing the residue of the first layer and a metal deposited on the residue of the first layer by the electroless plating and an alkaline solution used for dissolving the resin substrate to remove an area which supports the residue of the first layer.

DETAILED DESCRIPTION OF THE EMBODIMENT

The invention may provide a method of efficiently manufacturing a highly reliable wiring board.

(1) According to one embodiment of the invention, there is provided a method of manufacturing a wiring board, comprising:

providing a resin substrate on which is formed a metal layer including a first layer and a second layer formed on the first layer;

forming an interconnecting pattern by etching the metal layer so that the interconnecting pattern includes the patterned first layer and second layer and a part of the first layer remains outside the second layer as a residue of the first layer;

electroless plating the interconnecting pattern and the residue of the first layer; and then washing the resin substrate, the washing of the resin substrate being performed by using at least one of an acidic solution used for dissolving and removing the residue of the first layer and a metal deposited on the residue of the first layer by the electroless plating and an alkaline solution used for dissolving the resin substrate to remove an area which supports the residue of the first layer.

According to this embodiment, the resin substrate can be efficiently washed by using at least one of the acidic solution and the alkaline solution, whereby a highly reliable wiring board can be efficiently manufactured.

(2) In this method of manufacturing a wiring board, the residue of the first layer may include an area of the first layer which protrudes from the second layer of the interconnecting pattern.

(3) In this method of manufacturing a wiring board, the washing of the resin substrate may include:

a first washing performed by using the acidic solution; and a second washing performed by using the alkaline solution after the first washing.

(4) In this method of manufacturing a wiring board, the resin substrate may not be washed after formation of the interconnecting pattern and before the electroless plating.

This embodiment of the invention will be described below with reference to the drawings. FIGS. 1 to 9 are illustrative of a method of manufacturing a wiring board according to the embodiment of the invention.

Figure 1:
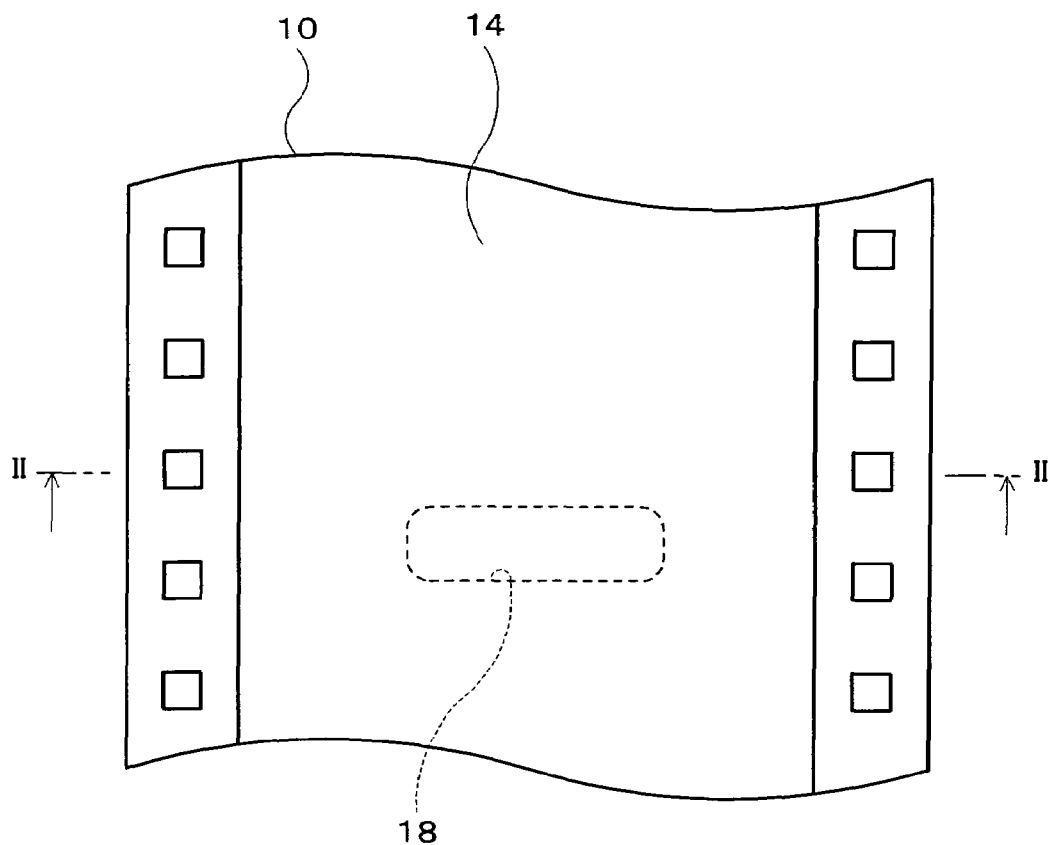
FIG. 1 is illustrative of a method of manufacturing a wiring board according to one embodiment of the invention.
Figure 2:
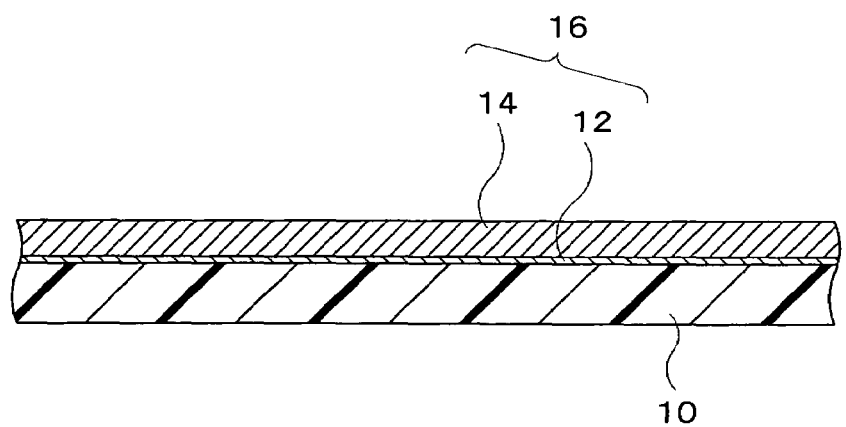
FIG. 2 is illustrative of a method of manufacturing a wiring board according to one embodiment of the invention.

The method of manufacturing a wiring board according to the embodiment includes providing a resin substrate 10 shown in FIGS. 1 and 2. FIG. 1 is a plan view of the resin substrate 10, and FIG. 2 is a partially enlarged view of the cross section along the line II-II shown in FIG. 1. As shown in FIG. 2, a metal layer 16 including a first layer 12 and a second layer 14 formed on the first layer 12 is formed on the resin substrate 10. The material and the structure of the resin substrate 10 are not particularly limited. A known resin substrate may be utilized. The resin substrate 10 may be either a flexible substrate or a rigid substrate. The resin substrate 10 may be a tape substrate (see FIG. 1 or 6). The resin substrate 10 may be either a stacked substrate or a single layer substrate. The external shape of the resin substrate 10 is not particularly limited. As shown in FIG. 1, the resin substrate 10 may have a device hole 18.

As shown in FIG. 2, the first layer 12 (e.g. NiCr) is formed on the resin substrate 10. The method of forming the first layer 12 is not particularly limited. The first layer 12 may be formed by forming a thin metal layer on the resin substrate 10 by sputtering or the like.

As shown in FIG. 2, the second layer 14 is formed on the first layer 12. The material and the structure of the second layer 14 are not particularly limited. A known metal may be utilized for the second layer 14. For example, the second layer 14 may be formed by stacking one or more of copper (Cu), chromium (Cr), titanium (Ti), nickel (Ni), titanium tungsten (Ti—W), gold (Au), aluminum (Al), nickel vanadium (NiV), and tungsten (W), or may be formed by a single layer of such a metal. The method of forming the second layer 14 is not particularly limited. The second layer 14 may be formed by causing copper foil to be grown on the surface of the first layer 12 by electrolysis plating.

Figure 3:
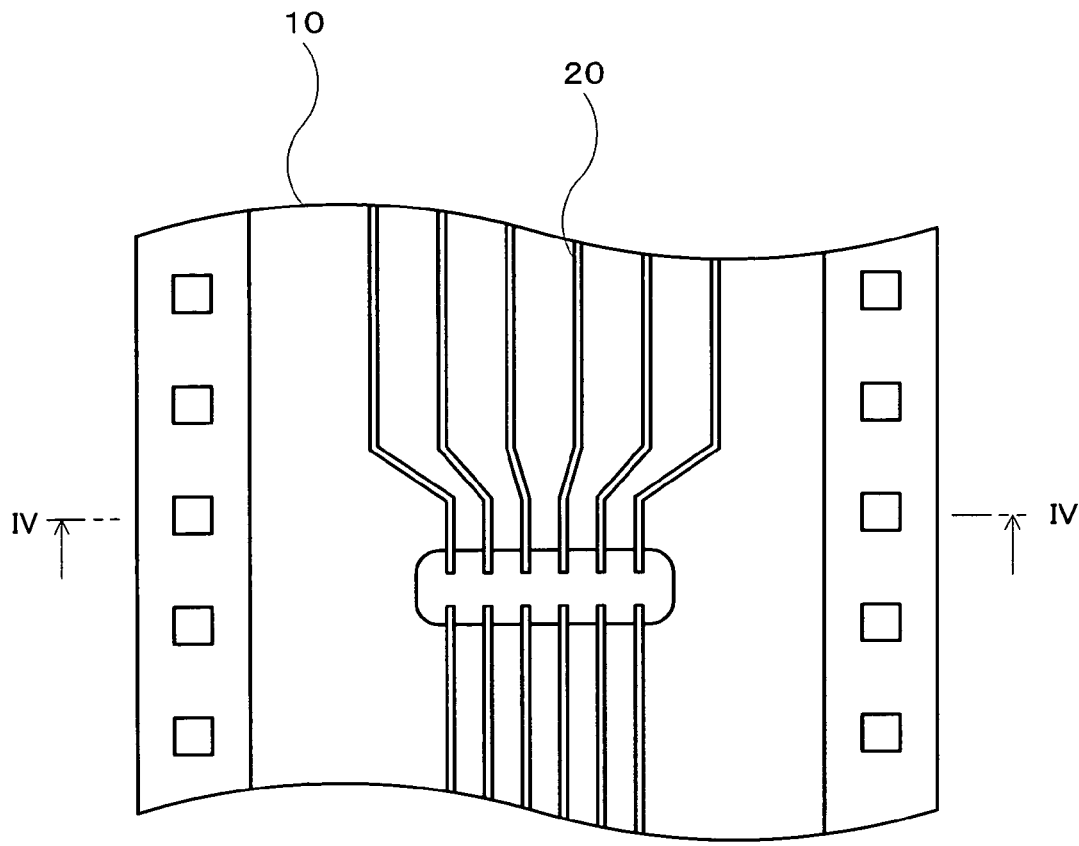
FIG. 3 is illustrative of a method of manufacturing a wiring board according to one embodiment of the invention.
Figure 4:
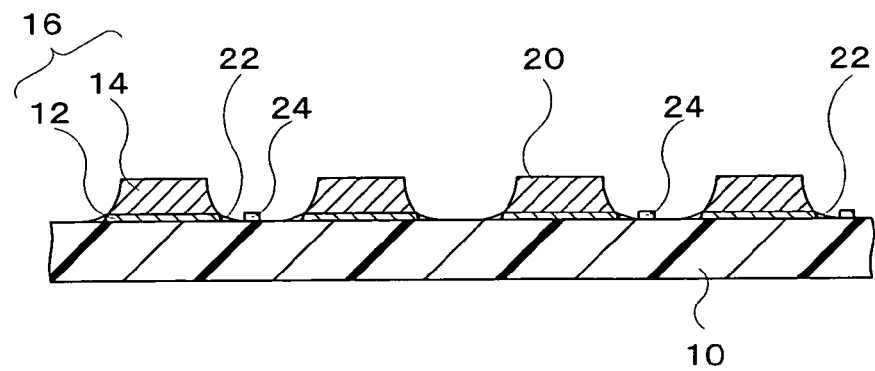
FIG. 4 is illustrative of a method of manufacturing a wiring board according to one embodiment of the invention.

The method of manufacturing a wiring board according to the embodiment includes forming an interconnecting pattern 20 on the resin substrate 10. FIG. 3 is a plan view of the resin substrate 10 on which the interconnecting pattern 20 is formed, and FIG. 4 is a partially enlarged view of the cross section along the line IV-IV shown in FIG. 3. The interconnecting pattern 20 is formed on the resin substrate 10 as shown in FIG. 3. The interconnecting pattern 20 is formed by etching the metal layer 16. The interconnecting pattern 20 is formed by the first layer 12 and the second layer 14 which are patterned and stacked. After etching the metal layer 16, residues 22 and 24 (part of the first layer 12) remain outside the second layer 14 of the interconnecting pattern 20. The residue 22 of the first layer 12 is an area of the first layer 12 which protrudes from the second layer 14 of the interconnecting pattern 20. The residue 22 is formed because the first layer 12 is etched to a lesser extent than the second layer 14 due to the difference in etching factor between the first layer 12 and the second layer 14. The residue 24 of the first layer 12 is a fragment separated from the first layer 12. It is preferable to remove the residues 22 and 24 of the first layer 12 in order to prevent deterioration of the quality of the wiring board and occurrence of migration. In the method of manufacturing a wiring board according to the embodiment, the resin substrate 10 is not washed in this stage (stage after formation of the interconnecting pattern and before electroless plating). This enables efficient formation of the wiring board. It should be appreciated that the invention does not exclude washing the resin substrate 10 after formation of the interconnecting pattern and before electroless plating.

Figure 5:
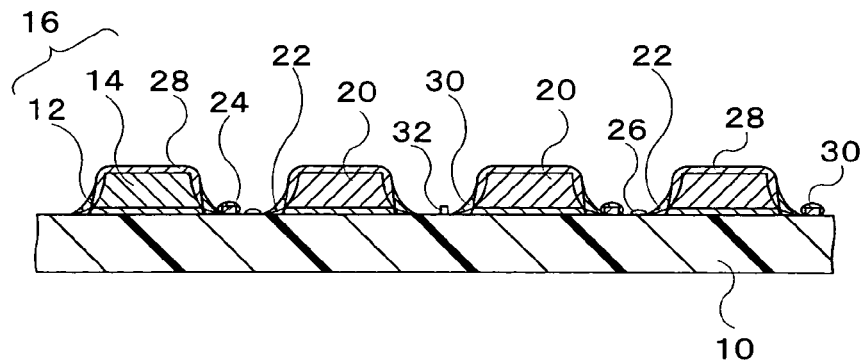
FIG. 5 is illustrative of a method of manufacturing a wiring board according to one embodiment of the invention.

The method of manufacturing a wiring board according to the embodiment includes electroless plating the interconnecting pattern 20 and the residues 22 and 24 of the first layer 12. As shown in FIG. 5, a metal is deposited on the interconnecting pattern 20 by electroless plating to form a plating layer 28. The metal may also be deposited on the residues 22 and 24 to form a plating layer 30. Electroless plating may be performed by utilizing a plating solution 26. A known plating solution may be utilized as the plating solution 26. A highly reliable wiring board which can be easily electrically connected with an electronic part such as a semiconductor chip can be formed by electroless plating. Electroless plating may include immersing the resin substrate 10 (interconnecting pattern 20) in the plating solution 26. The plating solution 26 may be a tin plating solution.

Specifically, the plating solution 26 may be a solution containing a tin ion. In this case, the interconnecting pattern 20 may be copper wiring. The plating layer 28 may be formed by replacing the surface of the interconnecting pattern 20 with tin. In this case, the plating layer 28 may be formed by an Sn—Cu alloy.

The plating solution 26 may be a plating solution containing at least one of thiourea and its derivative. In other words, electroless plating may be performed by utilizing a plating solution containing at least one of thiourea and its derivative.

Figure 6:
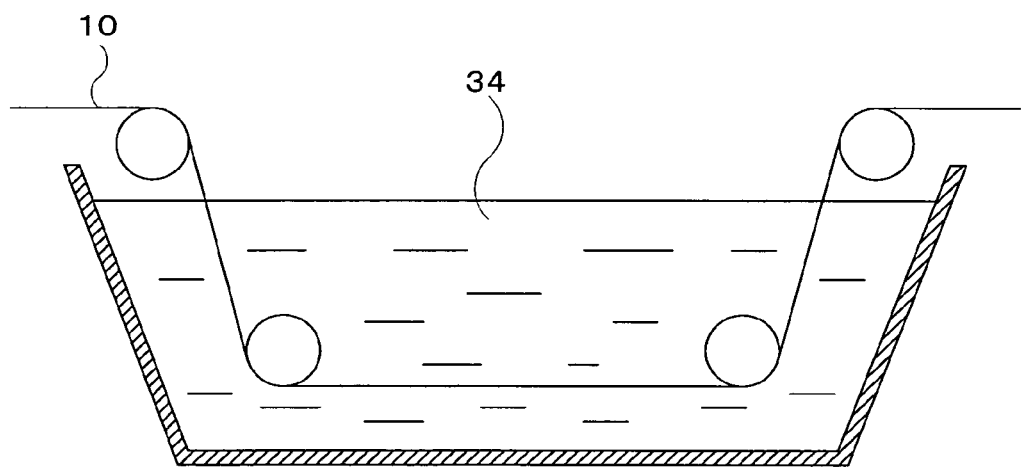
FIG. 6 is illustrative of a method of manufacturing a wiring board according to one embodiment of the invention.
Figure 7:
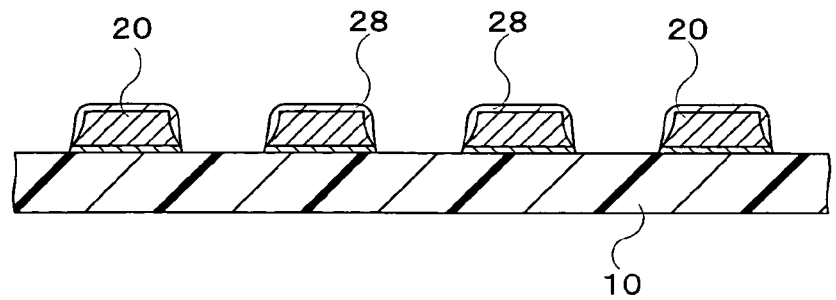
FIG. 7 is illustrative of a method of manufacturing a wiring board according to one embodiment of the invention.

The method of manufacturing a wiring board according to the embodiment includes washing the resin substrate 10. The resin substrate 10 is washed by using at least one of an acidic solution and an alkaline solution. The resin substrate 10 is washed after electroless plating. The washing of the resin substrate 10 may include immersing the resin substrate 10 in a solution 34 by reel-to-reel transport as shown in FIG. 6, for example. The resin substrate 10 may be washed by shower washing or a combined use of immersion and shower washing. As shown in FIG. 7, the residues 22 and 24 and the plating layer 30 on the residues 22 and 24 are removed from the surface of the resin substrate 10 or the interconnecting pattern 20 (plating layer 28) by washing the resin substrate 10.

The resin substrate 10 may be washed by utilizing an acidic solution for dissolving and removing the residues 22 and 24 and the plating layer 30 on the residues 22 and 24. The resin substrate 10 may be washed by only washing using the acidic solution. In this case, the resin substrate 10 is washed by utilizing the properties of the solution 34 (e.g. acidic solution) which dissolves a metal. Specifically, the residues 22 and 24 and the plating layer 30 which is the metal deposited on the residues 22 and 24 by electroless plating are dissolved by the solution 34. This allows the residues 22 and 24 and the plating layer 30 on the residues 22 and 24 to be removed.

The resin substrate 10 may be washed by using an alkaline solution for dissolving the resin substrate 10 to remove the area which supports the residues 22 and 24. The resin substrate 10 may be washed by only washing using the alkaline solution. In this case, the resin substrate 10 is washed by utilizing the effect of the solution 34 (e.g. alkaline solution) which dissolves the surface of the resin substrate 10. Specifically, the surface of the resin substrate 10 is dissolved by the solution 34. This allows the area which supports the residues 22 and 24 to be removed.

When the plating solution 26 contains at least one of thiourea and its derivative, a solution containing an amine may be used as the alkaline solution. When the plating solution 26 contains at least one of thiourea and its derivative, a thiourea complex formed from thiourea or its derivative exists in the plating solution 26 remaining on the resin substrate 10 after plating. Therefore, use of a solution (polar solvent) having a polarity similar to that of the thiourea complex allows the thiourea complex to be easily dissolved in the solution, so that the plating solution 26 may be efficiently removed from the resin substrate 10. Specifically, the plating solution 26 may be efficiently removed by using the solution 34 containing an amine having a polarity similar to that of the thiourea complex.

The amine contained in the solution 34 may be at least one of ethanolamine, propanolamine, butanolamine, N-(β-aminoethyl)ethanolamine, diethanolamine, dipropanolamine, N-methylethanolamine, isopropanolamine, and N-ethylethanolamine, for example. Or, the solution 34 may contain the above-mentioned amine and a glycol ether such as ethylene glycol monohexyl ether, ethylene glycol phenyl ether, diethylene glycol monomethyl ether, triethylene glycol monomethyl ether, or dipropylene glycol monomethyl ether. The washing effect may be increased by mixing the amine into the solution 34 at a concentration of 20 to 50%. The solution 34 may further contain a surfactant. This enables the plating solution 26 to be more efficiently removed.

In the method of manufacturing a wiring board according to the embodiment, the resin substrate 10 may be washed by washing using the acidic solution and washing using the alkaline solution. In this case, the washing of the resin substrate 10 includes a first washing performed by using the acidic solution, and a second washing performed by using the alkaline solution after the first washing. Specifically, the resin substrate 10 may be washed by using the acidic solution, and then washed by using the alkaline solution. Or, the washing of the resin substrate 10 may include a first washing performed by using the alkaline solution, and a second washing performed by using the acidic solution after the first washing. Specifically, the resin substrate 10 may be washed by using the alkaline solution, and then washed by using the acidic solution.

When washing the resin substrate 10 by washing using the acidic solution and washing using the alkaline solution, the solution used in the preceding washing step may be removed from the resin substrate 10 by the subsequent washing step. Or, the subsequent washing step may be performed so that the solution used in the preceding washing step is neutralized by the solution used in the subsequent washing step.

The washing step may be performed while heating the solution 34 (or the resin substrate 10 and the interconnecting pattern 20) at 30° C. or more, and preferably 50° to 70° C. with stirring. This enables the washing step to be efficiently performed. As the acidic solution and the alkaline solution, known solutions may be utilized. As the acidic solution, sulfuric acid or hydrochloric acid may be utilized. The washing step may include removing the solution 34 from the resin substrate 10.

The washing step is preferably performed so that the resin substrate 10 and the interconnecting pattern 20 (plating layer 28) are not damaged. The washing step may be performed while adjusting the concentration of the solution 34 and the washing time so that the resin substrate 10 and the interconnecting pattern 20 (plating layer 28) are not damaged. The resin substrate 10 may be washed by utilizing the physical force occurring when the solution 34 flows over the resin substrate 10.

In the method of manufacturing a wiring board according to the embodiment, a residue of the plating solution 26 may remain on the resin substrate 10 in addition to the plating layer 28, the plating layer 30, and the residues 22 and 24 immediately after electroless plating, as shown in FIG. 5. In particular, the plating solution 26 may remain inside the interconnecting pattern 20. Or, a metal 32 in the plating solution 26 may adhere to the resin substrate 10. In order to prevent deterioration of the quality of the wiring board and occurrence of migration, it is preferable to remove (wash) the residue of the plating solution 26 from the resin substrate 10 in addition to the plating layer 28, the plating layer 30, and the residues 22 and 24 by washing the resin substrate 10. It is also preferable to remove (wash) the metal 32 from the resin substrate 10.

The method of manufacturing a wiring board according to the embodiment may include heating the resin substrate 10 (plating layer 28). This prevents occurrence of whiskers so that a highly reliable wiring board can be manufactured.

Figure 8:
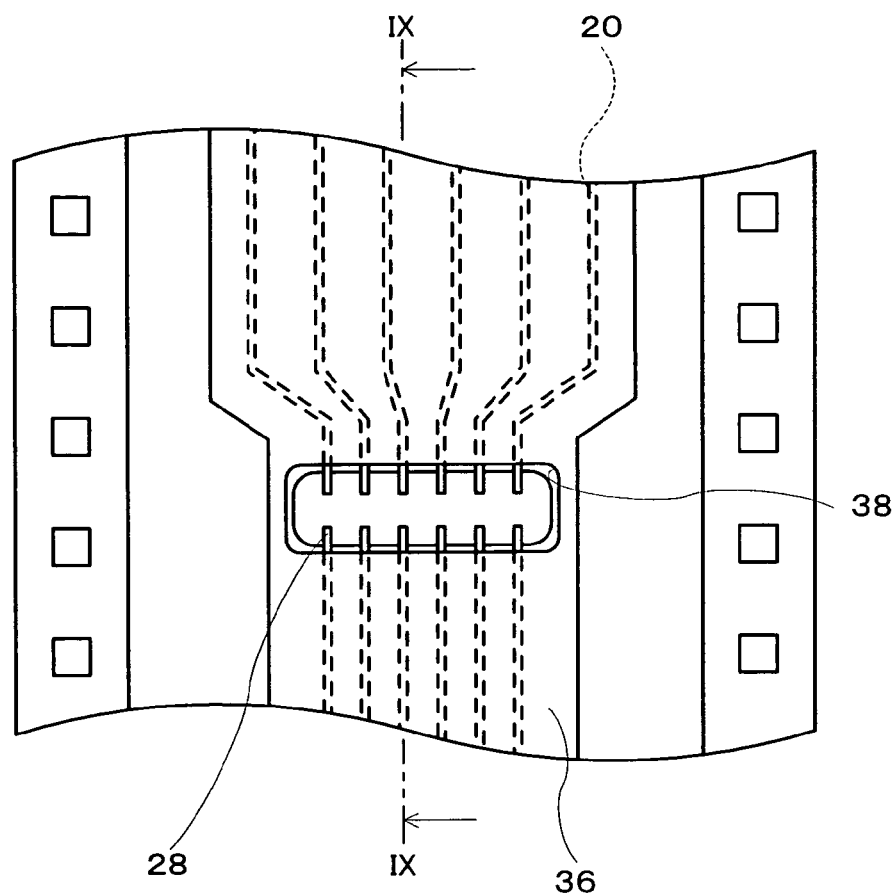
FIG. 8 is illustrative of a method of manufacturing a wiring board according to one embodiment of the invention.
Figure 9:
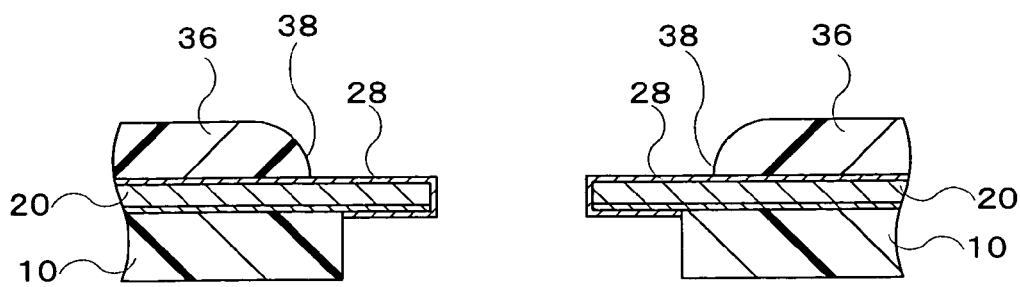
FIG. 9 is illustrative of a method of manufacturing a wiring board according to one embodiment of the invention.

The method of manufacturing a wiring board according to the embodiment may include forming a resist layer 36 on the resin substrate 10, as shown in FIGS. 8 and 9. The resist layer 36 may be formed to cover a part of the plating layer 28 (interconnecting pattern 20). FIG. 9 is a partial enlarged view of the cross section along the line IX-IX shown in FIG. 8. Since occurrence of corrosion of the plating layer 28 (interconnecting pattern 20), short circuits, and the like can be prevented by the resist layer 36, a highly reliable wiring board can be manufactured. As shown in FIG. 8, the resist layer 36 may have an opening 38. A part of the plating layer 28 may be exposed in the opening 38 and utilized for electrical connection with an electronic part such as a semiconductor chip. This step may be performed after washing (removing) the plating solution 26. This prevents the plating solution 26 from remaining in the space between the resin substrate 10 and the resist layer 36, whereby a highly reliable wiring board, in which deterioration of the quality or migration due to the plating solution 26 rarely occurs, can be manufactured. Then, an inspection step, a step of cutting the resin substrate 10, and the like may be performed to manufacture a wiring board 1 (see FIG. 10). The resin substrate 10 in a state in which the resin substrate 10 is not cut may be called a wiring board (see FIGS. 8 and 9).

Figure 10:
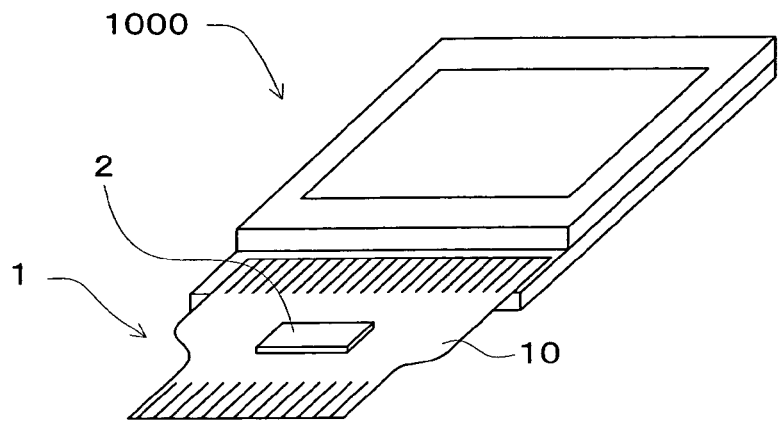
FIG. 10 shows an electronic module including a wiring board manufactured by the method according to one embodiment of the invention.
Figure 11:
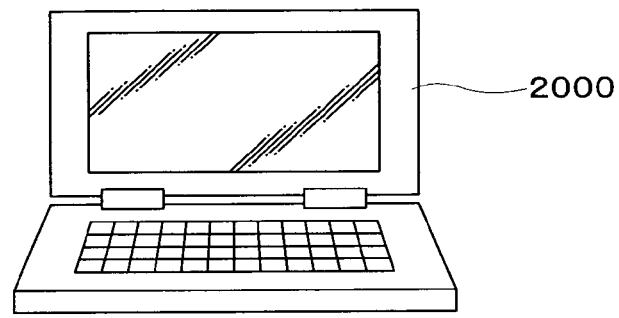
FIG. 11 shows an electronic instrument including a wiring board manufactured by the method according to one embodiment of the invention.
Figure 12:
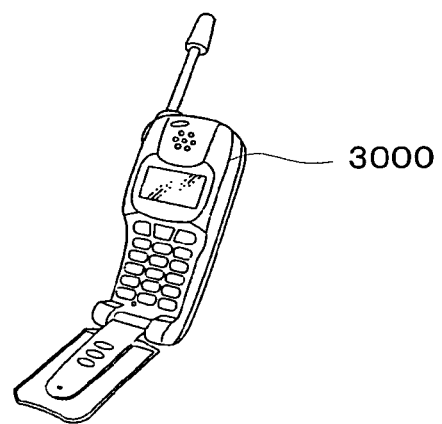
FIG. 12 shows another electronic instrument including a wiring board manufactured by the method according to one embodiment of the invention.

FIG. 10 shows an electronic module 1000 including the wiring board 1 manufactured by the method according to the embodiment to which the invention is applied. In the electronic module 1000, a semiconductor chip 2 is mounted on the wiring board 1. The method of mounting the semiconductor chip 2 is not particularly limited. A known mounting method may be applied. The electronic module 1000 may be a display device. The display device may be a liquid crystal display device or an electroluminescent (EL) display device, for example. FIGS. 11 and 12 respectively show a notebook-type personal computer 2000 and a portable telephone 3000 as electronic instruments including the wiring board 1.

The invention is not limited to the above-described embodiment, and various modifications can be made within the scope of the invention. For example, the invention includes various other configurations substantially the same as the configurations described in the embodiment (in function, method and result, or in objective and result, for example). The invention also includes a configuration in which an unsubstantial portion in the described embodiment is replaced. The invention also includes a configuration having the same effects as the configurations described in the embodiment, or a configuration able to achieve the same objective. Further, the invention includes a configuration in which a publicly known technique is added to the configurations in the embodiment. Further, the invention includes a configuration in which part of the technical items described in the embodiment is excluded. The invention also includes a configuration in which a publicly known technique is excluded from the above-described embodiments.

Although only some embodiment of the invention have been described in detail above, those skilled in the art will readily appreciate that many modifications are possible in the embodiment without departing from the novel teachings and advantages of this invention. Accordingly, all such modifications are intended to be included within the scope of this invention.

What is claimed is:

1. A method of manufacturing a wiring board, comprising:
providing a resin substrate on which is formed a metal layer including a first layer and a second layer formed on the first layer;
etching the metal layer to shape the first layer and the second layer into an interconnecting pattern and to leave a part of the first layer outside the second layer as a residue of the first layer;
electroless plating the interconnecting pattern and the residue of the first layer, and then
washing the resin substrate, the washing of the resin substrate being performed by using at least one of an acidic solution used for dissolving and removing the residue of the first layer and a metal deposited on the residue of the first layer by the electroless plating and an alkaline solution used for dissolving the resin substrate to remove an area which supports the residue of the first layer.

2. The method of manufacturing a wiring board as defined in claim 1,
wherein the residue of the first layer includes an area of the first layer which protrudes from the second layer of the interconnecting pattern.

3. The method of manufacturing a wiring board as defined in claim 1, wherein the washing of the resin substrate includes:
a first washing performed by using the acidic solution; and
a second washing performed by using the alkaline solution after the first washing.

4. The method of manufacturing a wiring board as defined in claim 1,
wherein the resin substrate is not washed after formation of the interconnecting pattern and before the electroless plating.

* * * * *